(12) United States Patent
O'Connell et al.

(10) Patent No.: US 10,684,611 B2
(45) Date of Patent: Jun. 16, 2020

(54) INDUSTRIAL CONTROL MODULE PROVIDING UNIVERSAL I/O

(71) Applicant: Rockwell Automation Technologies, Inc., Mayfield Heights, OH (US)

(72) Inventors: John R. O'Connell, Painesville, OH (US); Rajesh R. Shah, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 88 days.

(21) Appl. No.: 15/959,985

(22) Filed: Apr. 23, 2018

(65) Prior Publication Data
US 2019/0324429 A1 Oct. 24, 2019

(51) Int. Cl.
*G06F 3/00* (2006.01)
*G05B 19/418* (2006.01)
*G06F 13/10* (2006.01)
*H03K 17/687* (2006.01)
*H03F 3/45* (2006.01)

(52) U.S. Cl.
CPC ..... *G05B 19/41845* (2013.01); *G06F 13/102* (2013.01); *H03K 17/6877* (2013.01); *G05B 2219/33106* (2013.01); *H03F 3/45071* (2013.01); *H03F 2200/321* (2013.01); *H03F 2203/45151* (2013.01)

(58) Field of Classification Search
CPC ............ G05B 19/41545; G06F 13/102; H03K 17/6877
USPC .......................................................... 710/12
See application file for complete search history.

(56) References Cited

U.S. PATENT DOCUMENTS

| 4,593,380 | A | 6/1986 | Kocher et al. |
| 6,904,527 | B1* | 6/2005 | Parlour .................... G06F 21/76 |
| | | | 713/100 |
| 2002/0082725 | A1 | 6/2002 | Dute et al. |
| 2005/0030200 | A1* | 2/2005 | Holt ......................... H04Q 9/00 |
| | | | 340/870.07 |
| 2011/0282467 | A1 | 11/2011 | Schulte |

FOREIGN PATENT DOCUMENTS

EP 0546855 6/1993

OTHER PUBLICATIONS

Extended European Search Report dated Oct. 25, 2019 (12 pages).

* cited by examiner

*Primary Examiner* — Chun Kuan Lee
(74) *Attorney, Agent, or Firm* — Boyle Fredrickson, SC

(57) ABSTRACT

An industrial control I/O module for interfacing with industrial control equipment, such as sensors and actuators, can be configured to dynamically provide differing resistances in each channel as may be required for reliably achieving particular modes of operation in the channel. Providing differing resistances in such channels flexibly allows different modes in the channel to provide universal I/O capability. Modes of operation could include, for example, digital output, digital input, analog output, analog input and the like, in the same channel, but at different times. In one aspect, a processor or voltage divider can be used to control an amplifier, with feedback, driving a transistor in a channel to dynamically adjust resistance in the channel by selectively biasing the transistor to achieve a resistance in the channel suitable for the selected mode.

19 Claims, 3 Drawing Sheets

INDUSTRIAL CONTROL MODULE PROVIDING UNIVERSAL I/O

FIELD OF THE INVENTION

The present invention relates to the field of industrial automation, and more particularly, to a module for interfacing with industrial control equipment through one or more universal I/O channels in which resistances in such channels can be adjusted for various modes, such as modes for digital output, digital input, analog output, analog input and analog input with HART communications.

BACKGROUND OF THE INVENTION

Industrial controllers are specialized computer systems used for the control of industrial processes or machinery, for example, in a factory environment. Generally, an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. This modularity is facilitated through the use of special "control networks" suitable for highly reliable and available real-time communication. Such control networks (for example, ControlNet or EtherNet/IP) differ from standard communication networks (such as Ethernet) by guaranteeing maximum communication delays by pre-scheduling the communication capacity of the network, and/or providing redundant communication capabilities for high-availability.

As part of their enhanced modularity, industrial controllers may employ I/O modules or devices dedicated to a particular type of electrical signal and function, for example, detecting input AC or DC signals or controlling output AC or DC signals. Each of these I/O modules or devices may have a connector system allowing them to be installed in different combinations in a housing or rack along with other selected I/O modules or devices to match the demands of the particular application. Multiple or individual I/O modules or devices may be located at convenient control points near the controlled process or machine to communicate with a central industrial controller via the control network.

Before commissioning I/O modules in the system, it is typically necessary to determine the I/O requirements at various points of the controlled process or machine to properly match channels of the I/O modules to such requirements. For example, for analog sensors in a controlled process, such as level sensors for tanks, temperature sensors or position sensors, I/O modules having analog input channels should be used. However, for digitally controlled actuators in the controlled process, such as relays, indicator lights or small motors, I/O modules having digital output channels should be used.

As a result, resources are typically required for allocating and correctly matching channels of I/O modules to corresponding industrial control equipment. This requires time to implement, complexity to match, and limits flexibility of the system, particularly in the event that the controlled process or machine changes at a later date. Moreover, end users must typically purchase, maintain and store many different I/O modules to address each possible I/O type. If the required function of an I/O point changes due to a change in the, end users application, the I/O module often needs to be replaced causing inconvenience, additional cost and delay. It is therefore desirable to provide an I/O module for interfacing with industrial control equipment which eliminates one or more of the foregoing disadvantages.

SUMMARY OF THE INVENTION

An industrial control I/O module for interfacing with industrial control equipment, such as sensors and actuators, can be configured to dynamically provide differing resistances in each channel as may be required for reliably achieving particular modes of operation in the channel. Providing differing resistances in such channels flexibly allows different modes in the channel to provide universal I/O capability. Modes of operation could include, for example, digital output, digital input, analog output, analog input and the like, in the same channel, but at different times. In one aspect, a processor or voltage divider can be used to control an amplifier, with feedback, driving a transistor in a channel to dynamically adjust resistance in the channel by selectively biasing the transistor to achieve a resistance in the channel suitable for the selected mode.

Accordingly, the invention can provide a universal I/O channel configurable to support multiple different I/O types, such as: digital input; digital output; analog input; analog output; Highway Addressable Remote Transducer (HART) communications, a digital industrial automation protocol which can communicate over legacy 4-20 mA analog instrumentation wiring; User Association of Automation Technology in Process Industries (NAMUR), as described in DIN 19 234; and so forth. The universal I/O channel can provide a specific resistance to be established in the input or output channel for proper operation for each of these I/O types. Moreover, the invention can advantageously provide an I/O channel that can support currently defined, known I/O types, as well as yet to be defined, future I/O types, providing universal flexibility.

In one aspect, a circuit can be configured to allow I/O channel resistance to be dynamically changed (programmed) based on the I/O type being supported by the channel. The circuit can use the I/O channel current as well as the voltage to maintain the desired channel resistance. This resistance can be changed dynamically at any time as needed. The circuit can allow the universal I/O channel to support, for example, International Electrotechnical Commission (IEC) type 1, 2, 3 inputs, as well as NAMUR. Also, when in analog input mode, the circuit can configure a 250Ω input resistance optimal for HART communication.

In one aspect, a Field Effect Transistor (FET) in the channel can provide infinitely configurable channel resistances. A processor or other logic controller can be used to read I/O current and voltage levels. Resistances can be configured by processor (to adjust digital-to-analog converter (DAC) output) based on Ohm's law, Resistance=Voltage/Current. In another aspect, resistance of the channel can be adjusted by changing resistor values, including by configuring a digital potentiometer.

Such a circuit can allow any required channel resistance to be configured without the need of a physical resistor to be placed on a board for each value. Accordingly, existing as well as new input and/or output types can be supported without hardware changes. Also, such a circuit can allow many different I/O types to be supported by single channel, such as IEC type 1, 2, 3 inputs, NAMUR, analog input with HART communication, and so forth. Moreover, such a circuit could require less printed circuit board (PCB) space, thereby allowing higher channel counts. Power dissipation can also be determined and actively controlled. In one aspect, the circuit can be configured to protect itself by limiting the maximum current allowed to flow. Such operation can be accomplished actively with a processor or other control logic, or passively with the one or more discrete elements, such as a current sensing resistor.

Specifically then, one aspect of the present invention can provide a module for interfacing with industrial control equipment, including: a terminal configured to receive an electrical conductor in a channel interfacing with industrial control equipment; a variable resistance device connected to the terminal providing a resistance in the channel; and a control circuit connected to the variable resistance device. The control circuit can be configured to control the variable resistance device to adjust the resistance in the channel for a given mode selected from multiple modes. Each mode can configure a different resistance in the channel.

Another aspect of the present invention can provide an industrial control system including: an industrial controller executing a control program for controlling an industrial process; an I/O module in communication with the industrial controller, the I/O module providing a direct interface to industrial control equipment of the industrial process, the I/O module including: a terminal configured to receive an electrical conductor in a channel interfacing with the industrial control equipment; a variable resistance device connected to the terminal providing a resistance in the channel; and a control circuit connected to the variable resistance device. The control circuit can be configured to control the variable resistance device to adjust the resistance in the channel for a given mode selected from multiple modes. Each mode can configure a different resistance in the channel.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
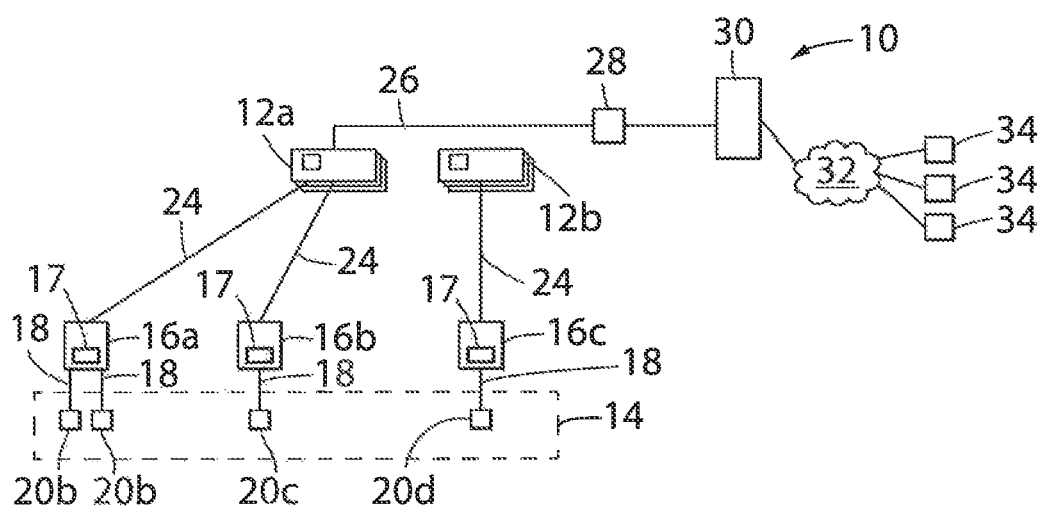
FIG. 1 is a simplified diagram of an exemplar industrial control system implementing I/O modules interfacing with industrial control equipment in accordance with an aspect of the invention.

Referring now to FIG. 1, an exemplar industrial control system 10 suitable for application of the present invention may provide one or more industrial controllers 12a, 12b, which could be programmable logic controllers (PLC's), operating to execute a control program for the control of an industrial process 14 as is generally understood in the art. The industrial process, for example, may coordinate a set of machines on an assembly line or the like, or interact with actuators, sensors and/or other industrial control equipment of plant processing materials to control that process, or conduct other similar control applications.

The industrial controllers 12 can communicate downstream with one or more control I/O modules 16a-16c providing a direct interface to industrial control equipment 20 of the industrial process 14. Such I/O modules 16 provide input and output lines via electrical conductors 18 to and from the industrial process 14 allowing communication with the industrial control equipment 20, such as equipment 20a-20d. The industrial control equipment 20 could include, for example: digital actuators, such as relays, indicator lights or small motors; digital sensors, such as photoelectric sensors, dry contact sensors, inductive sensors or push buttons; analog actuators, such as valves, positioners or meters; analog sensors, such as level sensors for tanks, temperature sensors or position sensors; and/or HART compatible devices.

The industrial controllers 12 can communicate with the control I/O modules 16 through an industrial control network 24, such as Common Industrial Protocol (CIP), EtherNet/IP, DeviceNet, CompoNet or ControlNet network, whose specifications are published and whose protocols are used broadly by a number of manufacturers and suppliers. Such networks provide for high reliability transmission of data in real time and can provide features ensuring timely delivery, for example, by pre-scheduling communication resources such as network bandwidth, network buffers, and the like.

The industrial controller 12 can also communicate upstream, through a data network 26 (which may, but need not be an industrial control network) via one or more routers or switches 28, with a central computer system 30. This latter computer system 30 may further communicate via the Internet 32 with remote devices 34 such as computer terminals, mobile wireless devices, and the like. Alternatively, there may be a direct connection between the industrial controller 12 and the Internet 32.

As is generally understood in the art, each of the I/O modules 16, industrial controllers 12, switches 28, computer system 30 and remote devices 34 may provide one or more electronic processors and associated electronic memory holding programs executable by the processors, some of which are described below.

Figure 2:
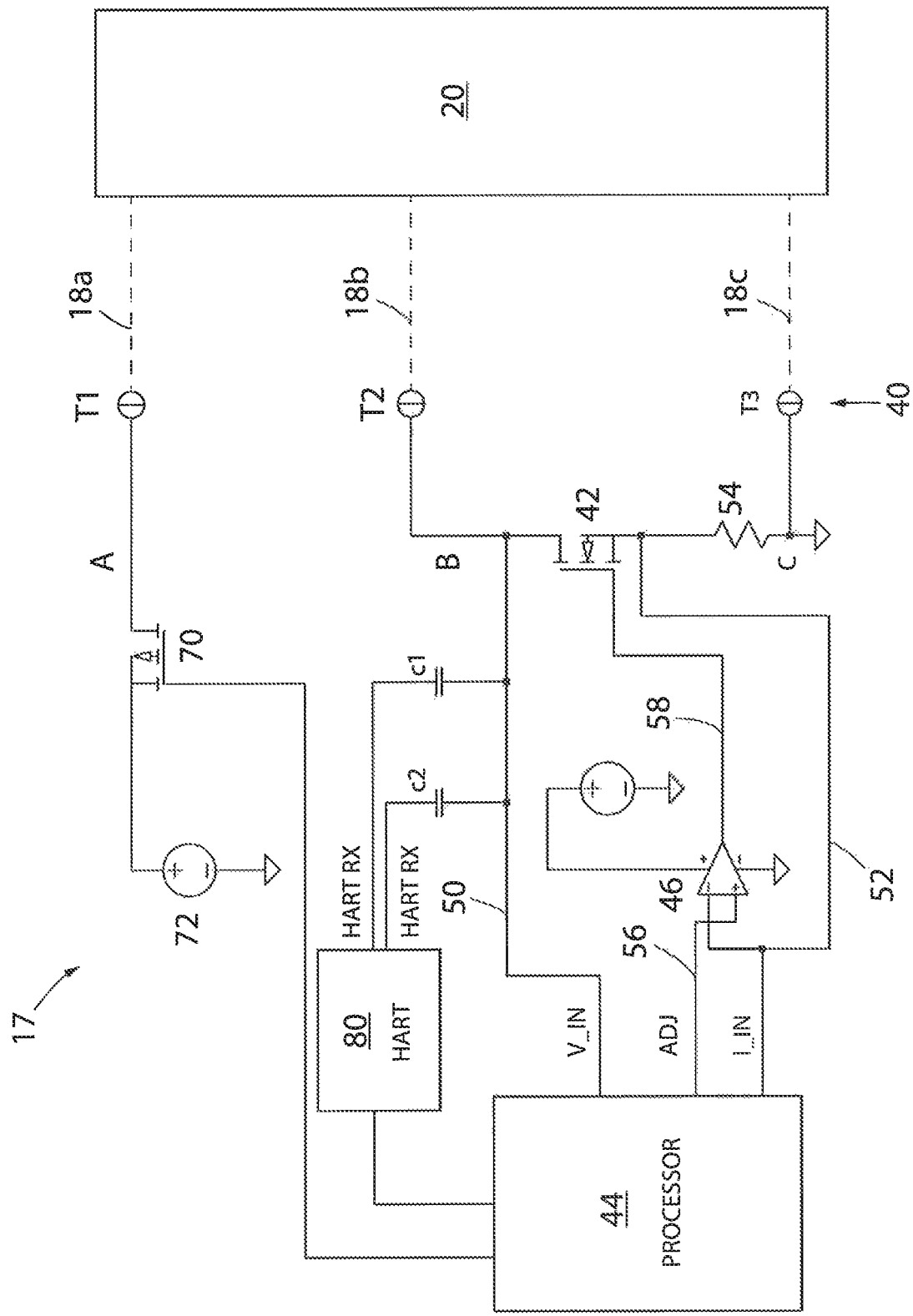
FIG. 2 is a schematic of a circuit portion of an I/O module for interfacing with industrial control equipment in the system of FIG. 1 in accordance with an aspect of the invention.

Referring now to FIG. 2, a schematic of a circuit portion 17 of an I/O module 16 for interfacing with industrial control equipment 20 in a universal I/O channel is provided in accordance with an aspect of the invention. In the circuit portion 17, the I/O module 16 can include multiple terminals 40, such as terminals T1, T2, T3, each being configured to receive electrical conductors, such as conductors 18a, 18b, 18c, respectively, in channels interfacing with the equipment 20. The conductors 18a, 18b, 18c are illustrated in phantom lines indicating the various possibilities for connection to the equipment 20 according to various devices and/or modes. Accordingly, the conductors 18 can be wires variously configured for communicating with equipment 20, which could comprise sensors or actuators, any of which may be digital, analog and/or HART devices, as may be desired at various points in the industrial process 14. Such conductors 18 can be releasably connected to the I/O module 16 at the terminals 40. In one aspect, the terminals 40 can be screw terminals in which a screw driver, such as a slotted or flat-blade screwdriver or other type, can be used to releasably connect the conductors 18 to the I/O module 16.

A variable resistance device 42, which can be a transistor, and which preferably can be a Field Effect Transistor (FET), can be connected to a terminal 40, such as the terminal T2, providing a resistance in the channel (identified as "B") in line with the conductor 18b. A control circuit, which in one aspect can include a processor 44 connected to an amplifier 46, can be connected to the variable resistance device 42. The control circuit can be configured to control the variable resistance device 42 to adjust the resistance in the channel in line with the conductor 18b for a given mode selected from multiple modes of operation. A mode of operation can be determined, such as by the processor 44, from user input which could indicate requirements for the equipment 20, which could be provided through a screen of a remote device 34, the central computer system 30 or the industrial controller 12 or to the I/O module 16 directly. Such user input may indicate, for example, power, voltage and/or current requirements for the equipment 20, or simply whether the equipment 20 is a predetermined device type, such as a digital sensor, including an IEC type 1, 2, 3 or NAMUR sensor, a digital actuator, an analog sensor, an analog sensor operating as a HART device, or an analog actuator, or a user defined device type. Determined modes of operation could then be set, such as digital output, digital input for IEC type 1, 2, 3 or NAMUR, analog output, analog input without HART communications, analog input with HART communications (which can be implemented in a 4-20 mA current loop), user defined, and so forth. Accordingly, each mode of operation could configure a different resistance in the channel specific for the device type.

For example, a mode for digital output could cause the control circuit to control the variable resistance device to minimize the resistance in the channel, preferably to 0Ω; a mode for digital input for IEC type 1, 2, 3 could cause the control circuit to control the variable resistance device to adjust the resistance in the channel to a higher resistance (than for analog input), such as to 3.3 kΩ; a mode for digital input for NAMUR could also cause the control circuit to control the variable resistance device to adjust the resistance in the channel to a higher resistance (than for analog input), but with less resistance than for IEC type 1, 2, 3, such as to 1 kΩ; a mode for analog output could cause the control circuit to control the variable resistance device to vary the resistance in the channel to maintain a constant current in the channel; a mode for analog input with HART communications could cause the control circuit to control the variable resistance device to adjust the resistance in the channel to a lower resistance (than for digital input), such as to 250Ω; and a mode for analog input without HART communications could also cause the control circuit to control the variable resistance device to adjust the resistance in the channel to a lower resistance (than for digital input), but even less resistance than for an analog input with HART communications, such as to 100Ω. Lowering the resistance in the channel even further, from 250Ω to 100Ω, for an analog input without HART communications, for example, can advantageously provide power savings in the system without requiring a single resistance for both types.

The control circuit can control the variable resistance device 42 to provide the resistance in the channel (B) as desired by receiving feedback from the channel for the amplifier 46 which, in turn, can provide the adjustment for the variable resistance device 42, such as by driving a gate of the FET to selectively bias the transistor to achieve a resistance in the channel suitable for the selected mode. In one aspect, a voltage feedback line 50 ("V_IN"), from a node between the variable resistance device 42 and the screw terminal T2, and a current feedback line 52 ("I_IN"), from a node between the variable resistance device 42 and a current sensing resistor 54, can be connected to the processor 44. The current sensing resistor 54 could be a nominal resistor, such as 20Ω, connected to ground. The processor 44, in turn, can calculate a resistance for the channel based on Ohm's law, Resistance=Voltage/Current, in this case, dividing voltage from the voltage feedback line 50 by current from the current feedback line 52. Based on the mode desired, the processor 44 can then execute to adjust the resistance in the channel by adjusting a digital-to-analog converter (DAC) output 56 ("ADJ") to an input of the amplifier 46, such as an inverting input ("−"), so that the amplifier 46, in turn, provides the adjustment to the variable resistance device 42 through a biasing line 58. The current feedback line 52 can also be provided to another input of the amplifier 46, such as a non-inverting input ("+"), providing a reference. The amplifier 46 could be, for example, an ADA 4891 Low Cost CMOS, High Speed, Rail-to-Rail Amplifier, as available from Analog Devices, Inc. of Norwood, Mass.

Figure 3:
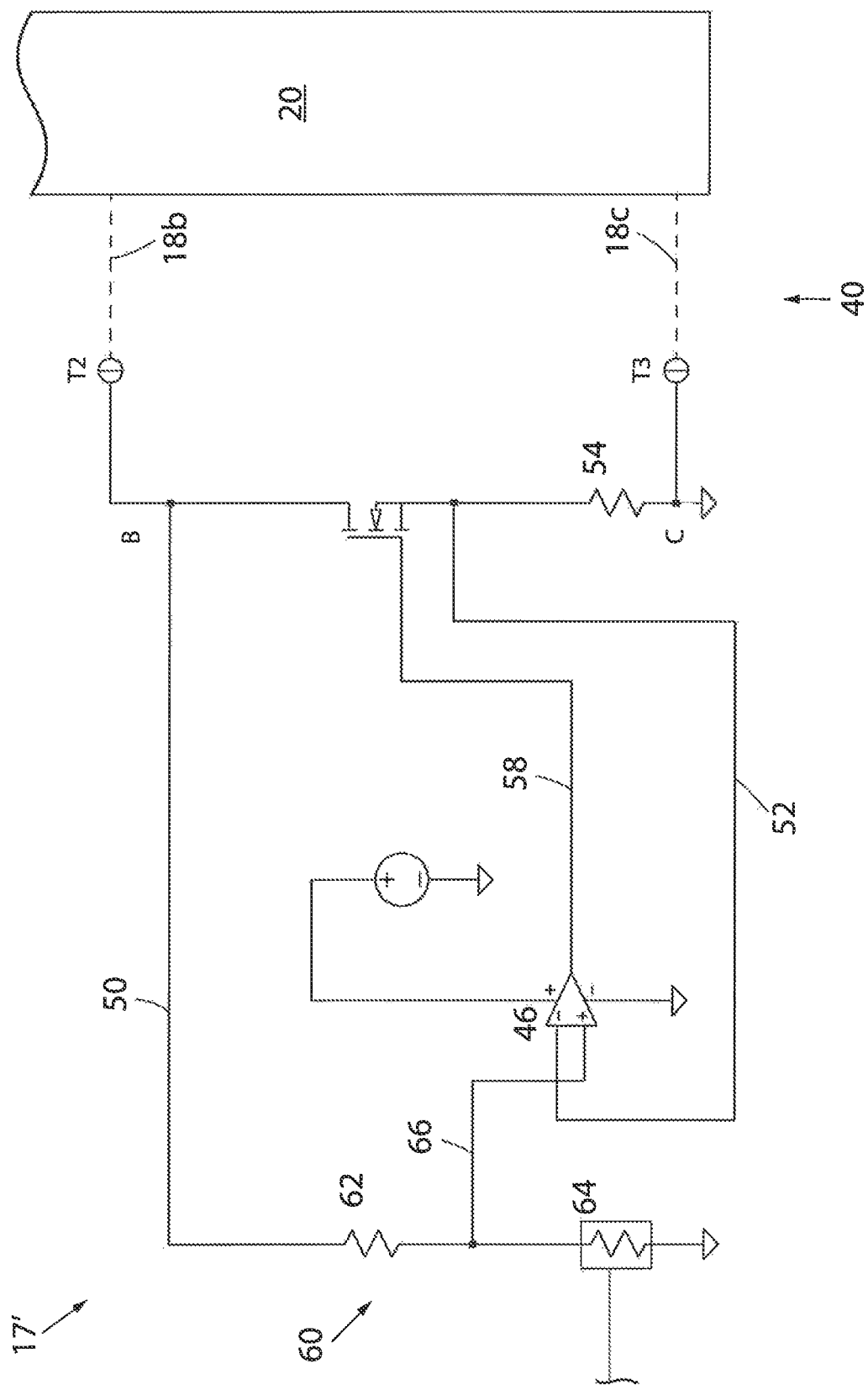
FIG. 3 is a schematic of an alternative circuit portion of an I/O module for interfacing with industrial control equipment in the system of FIG. 1 in which a resistor divider is used in accordance with aspect of the invention.

Referring briefly to FIG. 3, where like reference numerals represent like parts throughout, in an alternative aspect, an alternative circuit portion 17' illustrates an alternative control circuit for the I/O module 16. In the alternative control circuit, a resistor divider 60 can be connected to the amplifier 46. In this aspect, the voltage feedback line 50, from the node between the variable resistance device 42 and the screw terminal T2, can be connected to a first side of a first resistor 62 in the resistor divider 60. A second side of the first resistor 62, at an adjusting node 66, can be connected in series to a first side of a second resistor 64 in the resistor divider 60. The second side of the second resistor 64 can be connected to ground. The second resistor 64 could be, for example, a digital potentiometer which could be configured by a processor to implement various resistances. The adjusting node 66, in turn, can then adjust the resistance in the channel by adjusting input of the amplifier 46, such as the non-inverting input ("+"), so that the amplifier 46, in turn, provides the adjustment to the variable resistance device 42 through the biasing line 58. The current feedback line 52 can again be provided to another input of the amplifier 46, such as the inverting input ("−"), providing a reference. Accordingly, the processor, which could determine a given mode from user input, can configure the second resistor 64 (digital potentiometer) according to the given mode to implement the desired resistance in the channel.

Referring again to FIG. 2, various modes of operation which can be implemented by the I/O module 16, using the circuit portion 17 or the alternative circuit portion 17', include, for example: digital output, digital input for IEC type 1, 2, 3 or NAMUR, analog output, analog input without HART communications, analog input with HART communications (which can be implemented in a 4-20 mA current loop). Moreover, a further customized, user defined mode of operation can also be provided.

By way of example, in a first mode for digital output, such as for equipment 20 comprising digital actuators such as indicator lights or small motors, the processor 44 can control a switch 70 to selectively provide power from a power source 72 to terminal T1 in an output channel (identified as "A") as required by the digital device. A conductor 18*a*, releasably connected to the terminal T1, can provide such selectively delivered power to the equipment 20. A conductor 18*b*, releasably connected to the terminal T2, in turn, can provide a return path in a return channel (channel B), in line with the variable resistance device 42, from the equipment 20. In the return path (channel B), the control circuit (using processor 44 and/or resistor divider 60) can control the variable resistance device 42 to minimize the resistance in the channel, such as by biasing the FET to 0Ω, as may be required by the system.

In a second mode for IEC digital input, such as for equipment 20 comprising IEC type 1, 2, 3 digital sensors, such as photoelectric sensors, dry contact sensors, inductive sensors or push buttons, a conductor 18*b*, releasably connected to the terminal T2, can provide an input from the equipment 20. A conductor 18*c*, releasably connected to the terminal T3, can provide a return path in a return channel (channel C) connected to ground. In the input path (channel B), the control circuit (using processor 44 and/or resistor divider 60) can control the variable resistance device 42 to adjust the resistance in the channel to a higher resistance (than for analog input), such as to 3.3Ω, as may be required by the system.

In a third mode for NAMUR digital input, such as for equipment 20 comprising NAMUR sensors, a conductor 18*b*, releasably connected to the terminal T2, can again provide an input from the equipment 20. A conductor 18*c*, releasably connected to the terminal T3, can again provide a return path in a return channel (channel C) connected to ground. In the input path (channel B), the control circuit (using processor 44 and/or resistor divider 60) can control the variable resistance device 42 to adjust the resistance in the channel to a higher resistance (than for analog input), but with less resistance than for IEC type 1, 2, 3, such as to 1 k Ω.

In a fourth mode for analog output, such as for equipment 20 comprising analog actuators such as such as valves, positioners or meters, the processor 44 can control a switch 70 to selectively provide power from a power source 72 to terminal T1 in an output channel (identified as "A") as required by the analog device. A conductor 18*a*, releasably connected to the terminal T1, can provide such selectively delivered power to the equipment 20. A conductor 18*b*, releasably connected to the terminal T2, in turn, can provide a return path in a return channel (channel B), in line with the variable resistance device 42, from the equipment 20. In the return path (channel B), the control circuit (using processor 44 and/or resistor divider 60) can control the variable resistance device 42 to vary the resistance in the channel to maintain a constant current in the channel.

In a fifth mode for analog input with HART communications, such as for equipment 20 comprising HART compatible devices, a conductor 18*b*, releasably connected to the terminal T2, can provide an input from the equipment 20 to a HART modem 80. A conductor 18*c*, releasably connected to the terminal T3, can provide a return path in a return channel (channel C) connected to ground. In the input path (channel B), the control circuit (using processor 44 and/or resistor divider 60) can control the variable resistance device 42 to adjust the resistance in the channel to a lower resistance (than for digital input), such as to 250Ω.

In a sixth mode for analog input without HART communications, such as for equipment 20 comprising level sensors for tanks, temperature sensors or position sensors, a conductor 18*b*, releasably connected to the terminal T2, can again provide an input from the equipment 20. A conductor 18*c*, releasably connected to the terminal T3, can provide a return path in a return channel (channel C) connected to ground. In the input path (channel B), the control circuit (using processor 44 and/or resistor divider 60) can control the variable resistance device 42 to adjust the resistance in the channel to a lower resistance (than for digital input), but even less resistance than for an analog input with HART communications, such as to 100Ω. Lowering the resistance in the channel even further, from 250Ω to 100Ω, for an analog input without HART communications, for example, can advantageously provide power savings in the system without requiring a single resistance for both types. Additional user defined modes can be further configured, including for supporting future I/O types with existing hardware.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. A module for interfacing with industrial control equipment, comprising:
a terminal configured to receive an electrical conductor in a channel interfacing with industrial control equipment;
a variable resistance device connected to the terminal providing a resistance in the channel; and
a control circuit connected to the variable resistance device,
wherein the control circuit is configured to control the variable resistance device to adjust the resistance in the channel for a given mode selected from a plurality of modes, wherein each mode of the plurality of modes configures a different resistance in the channel, and wherein the plurality of modes includes modes for digital output, digital input, analog output and analog input.

2. The module of claim 1, wherein the terminal is a screw terminal, and wherein the variable resistance device is a transistor.

3. The module of claim 2, wherein the control circuit comprises a processor connected to an amplifier, wherein the transistor is a Field Effect Transistor (FET), and wherein the amplifier drives a gate of the FET.

4. The module of claim 3, further comprising a resistor for current sensing connected to the FET, wherein the resistor is further connected to a first input of the amplifier and the processor is connected to a second input of the amplifier.

5. The module of claim 3, wherein the given mode is determined by the processor from user input.

6. The module of claim 2, wherein the control circuit comprises a resistor divider connected to an amplifier, wherein the transistor is a Field Effect Transistor (FET), and wherein the amplifier drives a gate of the FET.

7. The module of claim 6, wherein the resistor divider comprises a resistor in series with a digital potentiometer.

8. The module of claim 7, further comprising a processor for configuring the digital potentiometer, wherein the given mode is determined by the processor from user input, and wherein the processor configures the digital potentiometer according to the given mode.

9. The module of claim 1, wherein the control circuit controls the variable resistance device to provide a higher resistance in the channel when the mode is for digital input and a lower resistance in the channel when the mode is for analog input.

10. The module of claim 1, wherein the plurality of modes further includes a mode for analog input with Highway Addressable Remote Transducer (HART) communications in a 4-20 mA current loop.

11. The module of claim 10, wherein the control circuit controls the variable resistance device to provide a higher resistance in the channel when the mode is for analog input and a lower resistance in the channel when the mode is for analog input with HART communications.

12. The module of claim 1, wherein the control circuit controls the variable resistance device to minimize the resistance in the channel when the mode is for digital output.

13. The module of claim 1, wherein the control circuit controls the variable resistance device to vary the resistance in the channel to maintain a constant current in the channel when the mode is for analog output.

14. The module of claim 1, wherein the terminal is a first terminal in a first channel, and further comprising a second terminal configured to receive an electrical conductor in a second channel interfacing with industrial control equipment comprising an actuator, and wherein the second channel provides an output from a power source to the industrial control equipment in the modes for digital output and analog output while the first channel provides a return path.

15. The module of claim 1, wherein the terminal is a first terminal in a first channel, and further comprising a second terminal configured to receive an electrical conductor in a second channel interfacing with industrial control equipment comprising a sensor, and wherein the first channel provides an input from the industrial control equipment in the modes for digital input and analog input while the second channel provides a return path to ground.

16. An industrial control system comprising:
an industrial controller executing a control program for controlling an industrial process;
an I/O module in communication with the industrial controller, the I/O module providing a direct interface to industrial control equipment of the industrial process, the I/O module comprising:
a terminal configured to receive an electrical conductor in a channel interfacing with the industrial control equipment;
a variable resistance device connected to the terminal providing a resistance in the channel; and
a control circuit connected to the variable resistance device,
wherein the control circuit is configured to control the variable resistance device to adjust the resistance in the channel for a given mode selected from a plurality of modes, wherein each mode of the plurality of modes configures a different resistance in the channel, wherein the given mode is determined from user input, and wherein the plurality of modes includes modes for digital output, digital input, analog output and analog input.

17. The industrial control system of claim 16, wherein the terminal is a screw terminal, and wherein the variable resistance device is a FET with the control circuit connected to a gate of the FET.

18. The industrial control system of claim 16, wherein the plurality of modes further includes a mode for analog input with HART communications.

19. The industrial control system of claim 18, wherein the control circuit controls the variable resistance device to minimize the resistance in the channel when the given mode is for digital output, and wherein the control circuit controls the variable resistance device to vary the resistance in the channel to maintain a constant current in the channel when the given mode is for analog output.

* * * * *